(12) United States Patent
Kim et al.

(10) Patent No.: US 7,902,526 B2
(45) Date of Patent: Mar. 8, 2011

(54) 3D TWO-PHOTON LITHOGRAPHIC MICROFABRICATION SYSTEM

(75) Inventors: Daekeun Kim, Cambridge, MA (US); Peter T. C. So, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 101 days.

(21) Appl. No.: 12/431,254

(22) Filed: Apr. 28, 2009

(65) Prior Publication Data

US 2009/0278058 A1 Nov. 12, 2009

Related U.S. Application Data

(60) Provisional application No. 61/048,284, filed on Apr. 28, 2008.

(51) Int. Cl.
*H04B 10/00* (2006.01)
*G02B 26/02* (2006.01)
*H01S 4/00* (2006.01)

(52) U.S. Cl. ........... 250/492.2; 250/492.1; 398/141; 398/180; 398/189; 359/326

(58) Field of Classification Search ......... 250/492.1, 250/492.2; 398/141, 180, 189; 359/326
See application file for complete search history.

(56) References Cited

U.S. PATENT DOCUMENTS

| | | | |
|---|---|---|---|
| 4,156,809 A * | 5/1979 | Phillips | 398/141 |
| 5,325,324 A | 6/1994 | Rentzepis et al. | |
| 6,998,214 B2 | 2/2006 | Fourkas et al. | |
| 7,011,925 B2 | 3/2006 | Alpert | |
| 7,110,677 B2 * | 9/2006 | Reingand et al. | 398/98 |
| 7,428,096 B2 * | 9/2008 | Nakazawa et al. | 359/326 |
| 2002/0023903 A1 | 2/2002 | Ann Ngoi et al. | |
| 2002/0093632 A1 | 7/2002 | Teich et al. | |
| 2004/0012872 A1 | 1/2004 | Fleming et al. | |
| 2004/0042937 A1 | 3/2004 | Bentsen et al. | |
| 2005/0254035 A1 | 11/2005 | Frankel | |
| 2006/0241585 A1 | 10/2006 | Silberberg et al. | |
| 2007/0028230 A1 | 2/2007 | Goetz et al. | |
| 2007/0079750 A1 | 4/2007 | Miguez et al. | |
| 2007/0291264 A1 | 12/2007 | Silberberg et al. | |

FOREIGN PATENT DOCUMENTS

| | | |
|---|---|---|
| WO | 2006030430 A2 | 3/2006 |
| WO | 2006030430 A3 | 3/2006 |

OTHER PUBLICATIONS

Kim et al., "Axial resolution for two-photon wide-field illumination microscopy and microfabrication" Multiphonon Microscpoy in Biomedical Sciences VIII, Edited by Ammasai Periasamy, Peter T.C.: Proc. of SPIE, 2008, vol. 6860, 68028-1~686028-7.

* cited by examiner

*Primary Examiner* — Nikita Wells
(74) *Attorney, Agent, or Firm* — Gauthier & Connors LLP (57) ABSTRACT

An imaging system is provided that includes a optical pulse generator for providing an optical pulse having a spectral bandwidth and includes monochromatic waves having different wavelengths. A dispersive element receives a second optical pulse associated with the optical pulse and disperses the second optical pulse at different angles on the surface of the dispersive element depending on wavelength. One or more focal elements receives the dispersed second optical pulse produced on the dispersive element. The one or more focal element recombine the dispersed second optical pulse at a focal plane on a specimen where the width of the optical pulse is restored at the focal plane.

24 Claims, 7 Drawing Sheets

3D TWO-PHOTON LITHOGRAPHIC MICROFABRICATION SYSTEM

PRIORITY INFORMATION

This application claims priority from provisional application Ser. No. 61/048,284 filed Apr. 28, 2008, which is incorporated herein by reference in its entirety.

SPONSORSHIP INFORMATION

This invention was made with government support awarded by the U.S. Army Research Office under Contract No. W911NF-07-D-004 and the Department of Energy Computational Science Fellowship under Contract No. DE-FG02-97ER25308. The government has certain rights in the invention.

BACKGROUND OF THE INVENTION

The invention is related to the field of multiphoton excitation microscopy/microfabrication, and in particular to axial resolution for two-photon wide-field illumination microscopy and microfabrication.

Multiphoton excitation fluorescence microscopy has recently gained popularity for cellular and tissue imaging. It provides intrinsic three-dimensional (3-D) resolution, allows deep imaging into tissues, achieves submicron optical resolution, and minimizes photodamage and photobleaching. Moreover, multiphoton excitation microfabrication has been also widely used since it can generate finer 3-D features than conventional two-dimensional (2-D) lithographic techniques. However, both systems use either laser scanning or laser writing technique to achieve this intrinsic optical sectioning capability based on spatially focusing laser light at the focal point of a high numerical aperture objective. It is common to implement laser scanning microscopy and laser writing microfabrication, but its major drawback is the longer image acquisition or fabrication time than that in the wide-field illumination based systems. This limits multiphoton fabrication in producing small prototypes although the submicron optical resolution and optical sectioning capabilities are very attractive for making 3-D structures.

Recently, the concept of temporal focusing was introduced, which disperses optical pulse into monochromatic waves at different angles on a grating surface and recombine them at focal plane. It is very useful in multiphoton depth-resolved wide-field illumination, since the original optical pulses are restored only at focal plane, and several applications in the nonlinear microscopy were proposed. However, temporal focusing has never been applied to 3-D lithographic microfabrication. In addition, depth discrimination capability for wide-field illumination system has not been fully evaluated both theoretically and empirically although it is one of the most important parameter in designing multiphoton wide-field illumination systems.

SUMMARY OF THE INVENTION

According to one aspect of the invention, there is provided an imaging system. The imaging system includes a optical pulse generator for providing an optical pulse having a spectral bandwidth and includes monochromatic waves having different wavelengths. A dispersive element receives a second optical pulse associated with the optical pulse and disperses the second optical pulse at different angles on the surface of the dispersive element depending on wavelength. One or more focal elements receive the dispersed second optical pulse produced on the dispersive element. The one or more focal element recombine the dispersed second optical pulse at a focal plane on a specimen where the width of the optical pulse is restored at the focal plane.

According to another aspect of the invention, there is provided a method of performing operations an imaging system. The method includes providing an optical pulse having a spectral bandwidth and includes monochromatic waves having different wavelengths and receiving a second optical pulse associated with the optical pulse. Also, the method includes dispersing the second optical pulse at different angles depending on wavelength. Moreover, the method includes recombining the dispersed second optical pulse at a focal plane on a specimen where the width of the optical pulse is restored at the focal plane.

According to another aspect of the invention, there is provided a method of forming an imaging system. The method includes providing a optical pulse generator for providing an optical pulse having a spectral bandwidth and includes monochromatic waves having different wavelengths. Also, the method includes positioning a refractive dispersive element to receive a second optical pulse associated with the optical pulse and disperses the second optical pulse at different angles on the surface of the dispersive element depending on wavelength. Furthermore, the method includes arranging one or more focal element to receive the dispersed second optical pulse produced on the dispersive element. The one or more focal element recombines the dispersed second optical pulse at a focal plane on a specimen where the width of the optical pulse is restored at the focal plane.

DETAILED DESCRIPTION OF THE INVENTION

The invention proposes the design of a 3-D multiphoton lithographic system which generates 3-D microstructures with multiphoton wide-field illumination. This is the first time a microfabrication technique with multiphoton wide-field illumination is introduced. A mathematical model has been derived based on diffraction theory, to predict the axial resolution for both multiphoton wide-field illumination microscopy and microfabrication based on numerical simulation. Finally, the design parameters to improve axial resolution are reviewed. Future works include combining this optical model with a photopolymerization process model to predict fabrication efficiency and resolution.

Figure 1:
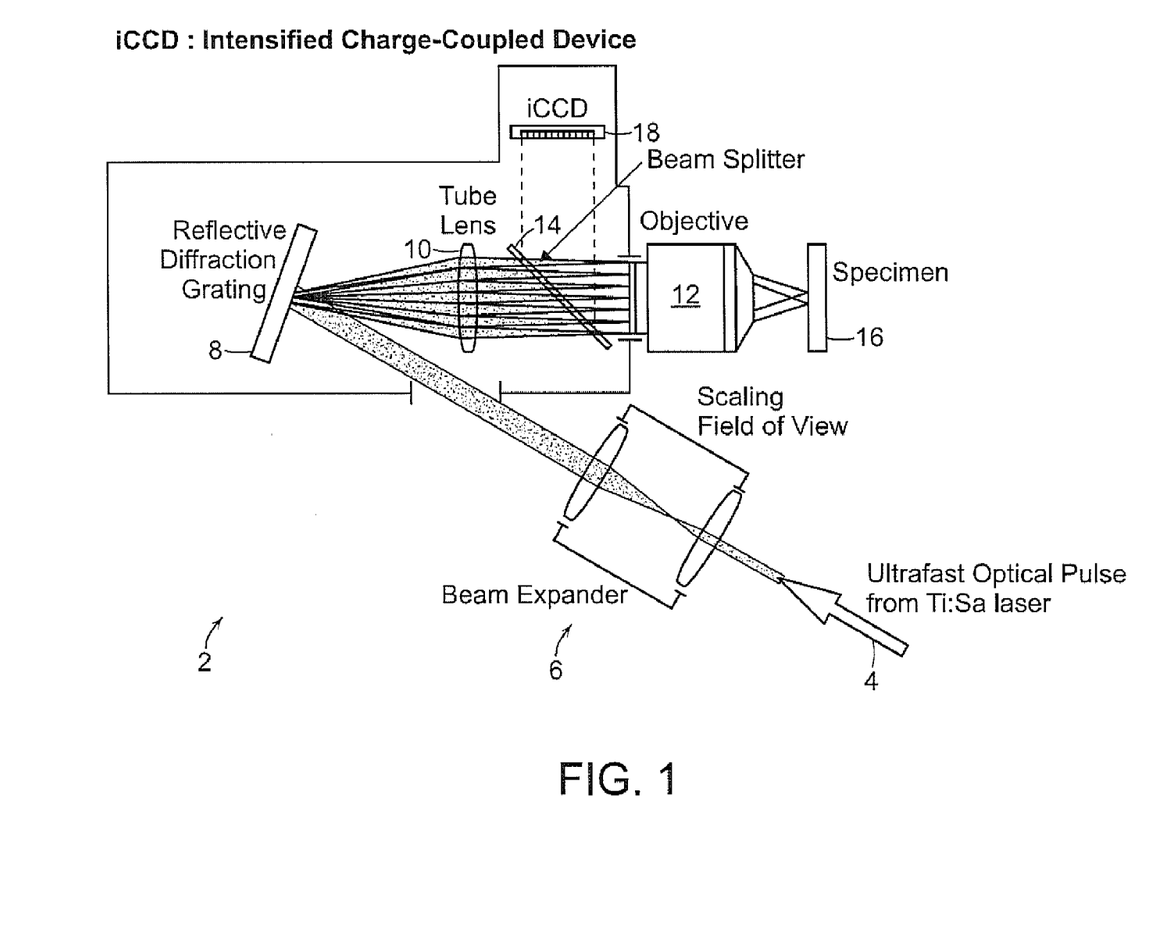
FIG. 1 is a schematic diagram illustrating depth-resolved wide-field illumination multiphoton excitation microscopy.

FIG. 1 shows a microscopic imaging system 2 based on depth-resolved widefield illumination. The microscopic imaging system 2 includes a 4-f imaging system and a reflective diffraction grating structure 8 acting as a dispersive element. If a mirror is located at the image plane instead of the reflective diffraction grating structure, microscopic imaging system 2 works as conventional widefield illumination microscopy without depth-resolving capability. In order to enable depth discrimination, the temporal focusing is introduced. Ultrafast optical pulses 4 are introduced having spectral bandwidth, and includes monochromatic waves with different wavelengths. A beam expander 6 controls the illumination field of view size at the Specimen 16 and a reflective diffraction grading structure 8 disperses the ultrafast optical pulses 4 at different angles, depending on the wavelength. Each monochromatic wave diffracts with different angles on the surface of the reflective diffraction grating structure 8, depending on wavelength, propagates through a tube lens 10, beam splitter 14, and an objective 12.

These monochromatic waves are recombined only at the focal plane on the specimen 16, and the width of the ultrafast optical pulses 4 is also restored at that plane. Far from the focal plane, the optical pulses 4 become broadened since it combines out of phase. It causes fluorescence yield to drop since broadened optical pulse has low instantaneous intensity. Therefore, temporal focusing enables optical section by preferentially exciting only the focal plane. By moving specimen 16 along optical axis, images at different planes of the specimen 16 can be also obtained. Fluorescence 2-D images are acquired by locating the intensified charged-couple device (iCCD) 18 at the conjugate plane of the object plane. Note in other embodiments of the invention the reflective diffraction grating structure 8 can also serve as a transmission dispersive element.

Figure 2:
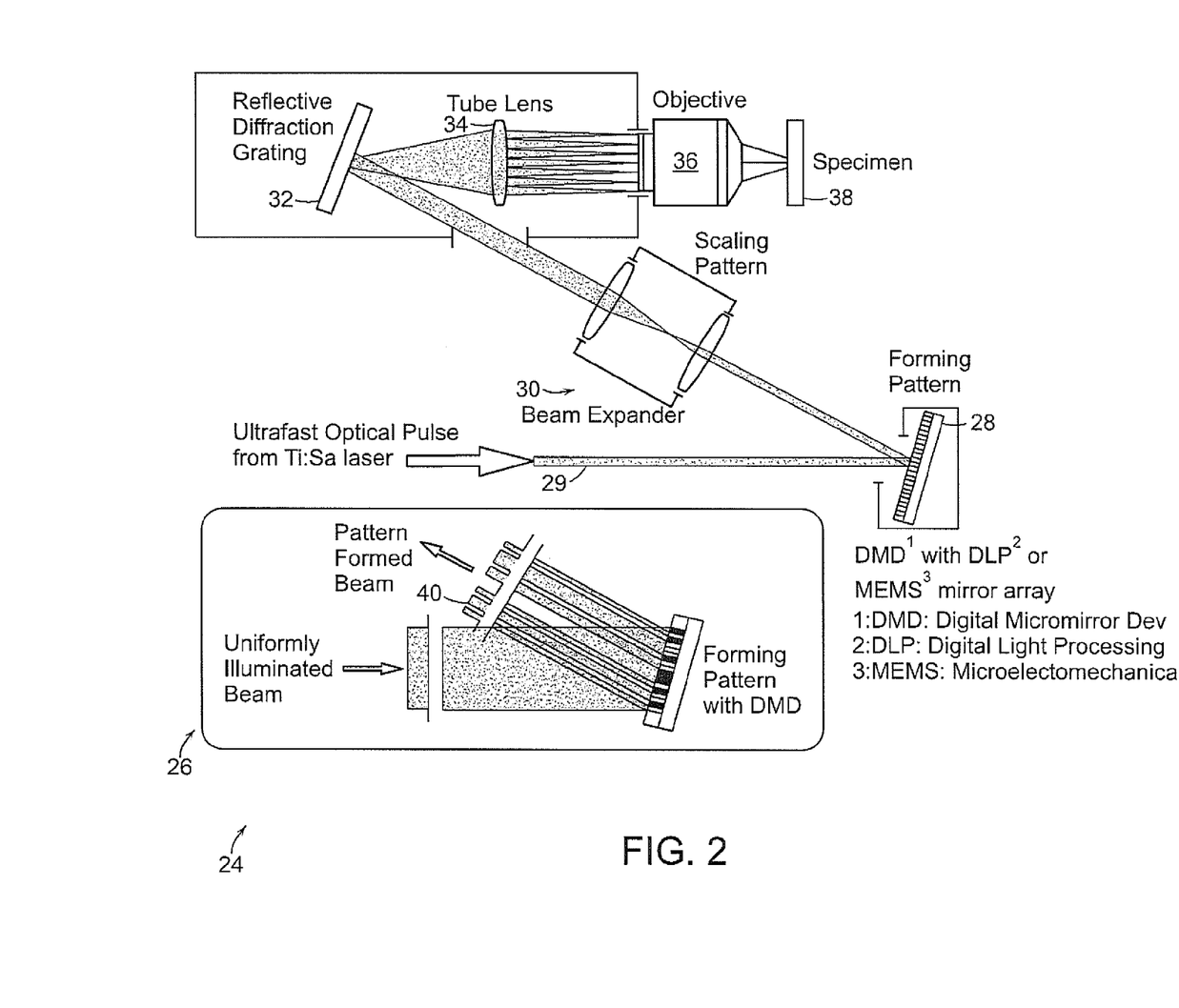
FIG. 2 is a schematic diagram illustrating depth-resolved wide-field illumination microfabrication.

FIG. 2 is schematic diagram illustrating the depth-resolved wide-field illumination multiphoton excitation microfabrication 24. The basic concept of temporal focusing is same, and pattern forming device 28 such as a digital micromirror device (DMD) with digital light processing (DLP), spatial modulator, or a microelectromechanical system (MEMS) mirror array can be inserted in order to generate a 2-D pattern at the focal plane. In other embodiments of the invention, the. It is very similar to microscopic imaging system 2 shown in the FIG. 1. However, the DMD with DLP or MEMS mirror array 28 is incorporated to generate a 2-D pattern formed beam 40 projected to the focal plane in the specimen 38. By moving the specimen 38, different 2-D patterns are made with mirrors for the different depth. A beam expander 30 controls the field of view size of the 2-D pattern formed beam 40 using ultrafast optical pulses 29, and a reflective diffraction grading structure 32 disperses the 2-D pattern formed beam 40 at different angles, depending on the wavelength. Note in other embodiments of the invention the reflective diffraction grating 32 structure can also serve as a transmission dispersive element. Each monochromatic wave is directed to a different angle on the surface of the reflective diffraction grating structure 32, depending on wavelength, propagates through a tube lens 34 and an objective 36. In other embodiments of the invention, a digital micromirror device (DMD) with digital light processing (DLP), a spatial modulator, or a microelectromechanical system (MEMS) mirror array can be inserted after dispersion by reflective diffraction grating structure 32 or respective transmission dispersive element for pattern forming.

These monochromatic waves are recombined only at the focal plane in the specimen 38, and the width of the 2-D pattern formed beam 40 is also restored at focal plane. By moving the specimen 38 along an optical axis, different patterns at different planes of the specimen 38 can be fabricated.

The desired 2-D pattern formed beam 40 can be generated by using the DMD as an intensity based spatial light modulator, see insert 26, positioning at a conjugate plane of the specimen 38. 2-D patterned illumination is delivered to focal plane instead of an uniform illumination used in imaging system 2. Due to the axial discrimination of this process, the pattern will be generated only at the focal plane in the specimen 38. When the specimen 38 moves to next depth section, the mirrors can be reconfigured and new patterns can be created at a different plane.

In order to optimize the design of the 3-D two-photon lithographic microfabrication system, it is important to thoroughly understand the image formation theory underlying this approach. One can derive an optical model of light distribution near the focal plane based on diffraction theory. This optical model allows one to accurately predict the axial resolution that can be achieved. Further, this optical model allows one to examine the effects of different design parameter choices in optimizing performance.

First, it is assumed that the input beam profile is Gaussian with a width of S (1/e beam radius). The spectral distribution of the input beam is also assumed to be Gaussian with a bandwidth of $\Omega$. The transverse field has the form:

$$U_0(x, y, \Delta\omega) = A_0 \exp\left\{-\frac{x^2 + y^2}{S^2}\right\} \cdot \exp\left\{-\frac{\Delta\omega^2}{\Omega^2}\right\} \quad (1)$$

where (x, y) are the lateral coordinate, and $A_0$ is the amplitude. $\Delta\omega = \omega - \omega_0$ where $\omega$ is the angular frequency, and $\omega_0$ is the center frequency. To examine how this wave propagates through an optical system as shown on FIGS. 1 and 2, one can further assume that the lenses are perfectly chromatic-aberration-corrected with no dispersion. Also, it is assumed that the system is completely diffraction limited. With these assumptions, one can write the field at grating surface as:

$$U_1(x_1, y_1, \Delta\omega) = U_0(x_1, y_1\Delta\omega)\exp\left\{i\frac{\Delta\omega}{c}\sin\alpha \cdot x_1\right\} \quad (2)$$

where c is the speed of light, and (x1, y1) are the lateral coordinates at the grating plane. The grating effectively introduces a phase chirp along one direction $\alpha = \sin^{-1}(2\pi cG/\omega_0)$ is the incident angle to the grating with groove frequency G such that the center wavelength of the input beam propagates along the optical axis. Since the grating and the microscope focal plane is conjugated by a 4-f imaging system, the field can be readily propagated along the optical path. Ignoring the field aperture of the microscope, the field at back aperture of the objective is:

$$U_2(x_2, y_2, \Delta\omega) = -i\frac{\exp\{ik2f_1\}}{\lambda f_1} \quad (3)$$

$$\int_{-\infty}^{\infty}\int_{-\infty}^{\infty} U_1(x_2, y_2, \Delta\omega)\exp\left\{-i2\pi\frac{x_1 x_2 + y_1 y_2}{f_1 \lambda}\right\}dx_1\,dy_1$$

where $f_1$ is the focal length of the tube lens, $k=\omega/c$, $\lambda=2\pi/k$, $(x_2, y_2)$ are the lateral coordinate of the back aperture plane. The field near the focal plane can be calculated as:

$$U_3(x_2, y_2, \Delta\omega) = \\ -i\frac{\exp\{ik(2f_2+z_3)_1\}}{\lambda f_1} \int_{-\infty}^{\infty}\int_{-\infty}^{\infty} U_2(x_2, y_2, \Delta\omega)\exp\left\{-i\pi\frac{x_2^2+y_2^2}{f_2}\frac{z_3}{f_2}\right\} \\ \exp\left\{-i2\pi\frac{x_1x_3+y_1y_3}{f_2\lambda}\right\}dx_2\,dy_2 \quad (4)$$

Since the tube lens and the objective are chromatic-aberration-corrected, the effective optical path lengths (phase terms) are same for the different wavelength $\lambda$ or wave vector k at the focal plane.

$$\exp\{i2k(f_1+f_2)\}=\text{const} \quad (5)$$

The temporal evolution of the field and the time averaged intensity close to the focal plane can be expressed as:

$$U_3(x_3, y_3, z_3, t) = \int_{-\infty}^{\infty} U_2(x_2, y_2, \Delta\omega)\exp(-i\omega t)d\omega \quad (6)$$

$$I(x_3, y_3, z_3) = \frac{1}{T}\int_0^T |U_3(x_3, y_3, z_3, t)|^2 dt \quad (7)$$

Since multiphoton excitation is nonlinear process, excitation efficiency is proportional to $N^{th}$ power of the intensity if N-photon excitation process happens.

$$I^N(x_3, y_3, z_3) = \frac{1}{T}\int_0^T |U_3(x_3, y_3, z_3, t)|^{2N} dt \quad (8)$$

Figure 3A:
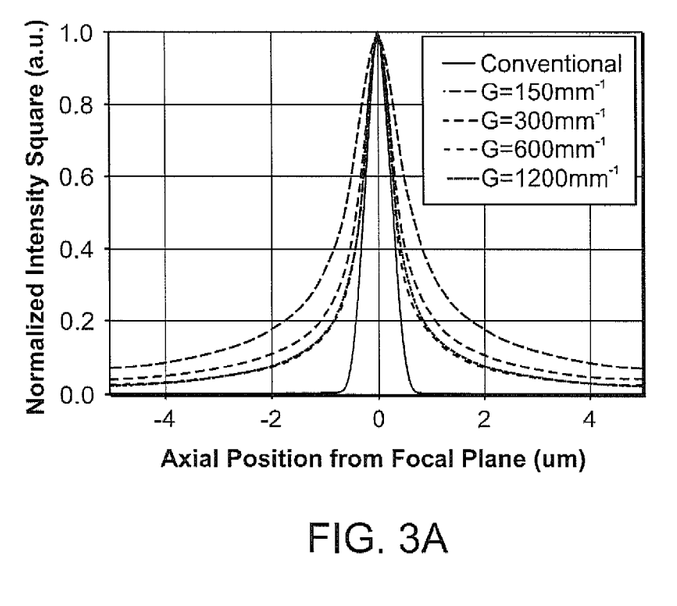
FIG. 3A-3B are graphs illustrating results for intensity square along an optical axis with different groove frequency of a grating.
Figure 3B:
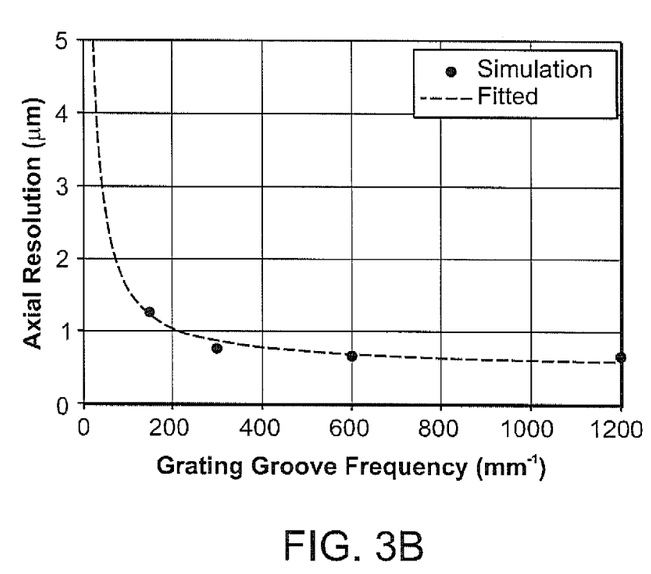

The axial optical resolution for the inventive system is simulated by using the mathematical model derived herein. Axial resolution in two-photon excitation microscopy is defined as the full width at half maximum (FWHM) of the squared average intensity. For the two-photon excitation, the two-photon-induced photochemical reaction will depend quadratically on the time averaged intensity, for example, $I^2$. From this calculation, one can examine the grating frequency, G, on the axial resolution, as shown in FIG. 3A. As G decreases, optical resolution also increases (worsens) since decreasing dispersion angle underfills the back aperture of the objective, as shown in FIG. 3B. So, optical resolution is inversely proportional to numerical aperture (NA).

Figure 4A:
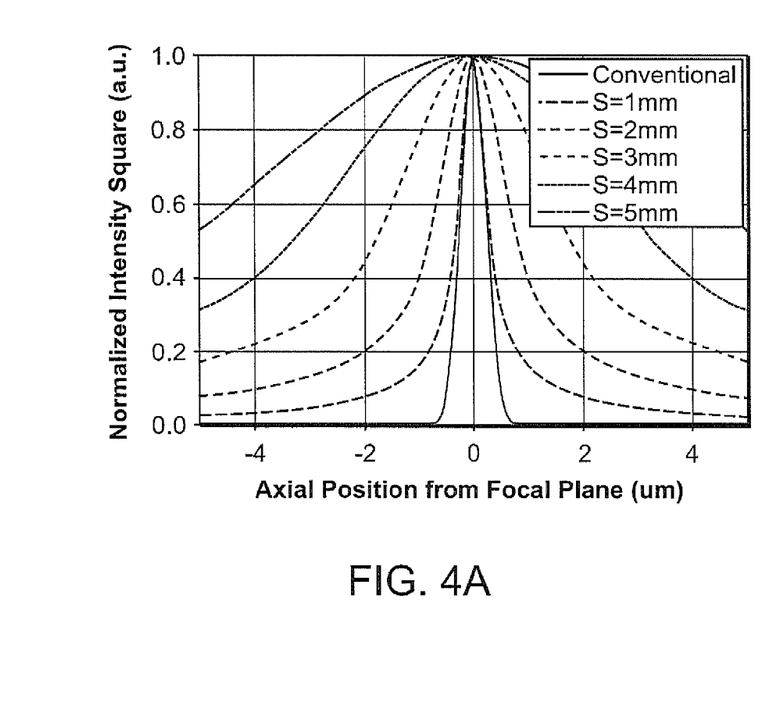
FIGS. 4A-4B are graphs illustrating results for intensity square along an optical axis with different Gaussian beam 1/e radius.
Figure 4B:
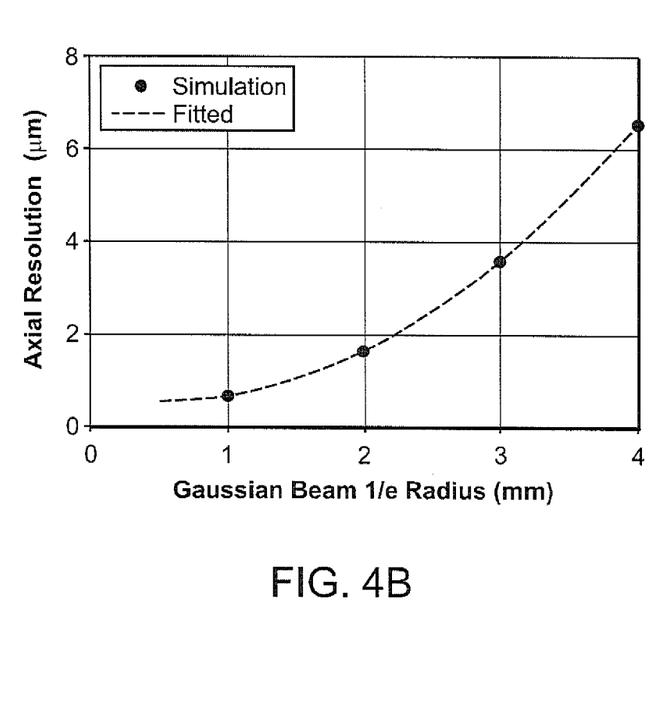

One can investigate how the field of view (FOV) is related to S. As S increases as shown in FIG. 4A, optical resolution also increases (worsens) since increasing beam diameter results in less pulse width broadening outside the focal plane, as shown in FIG. 4B. Therefore, optical resolution is proportional to FOV area, or $S^2$.

Figure 5A:
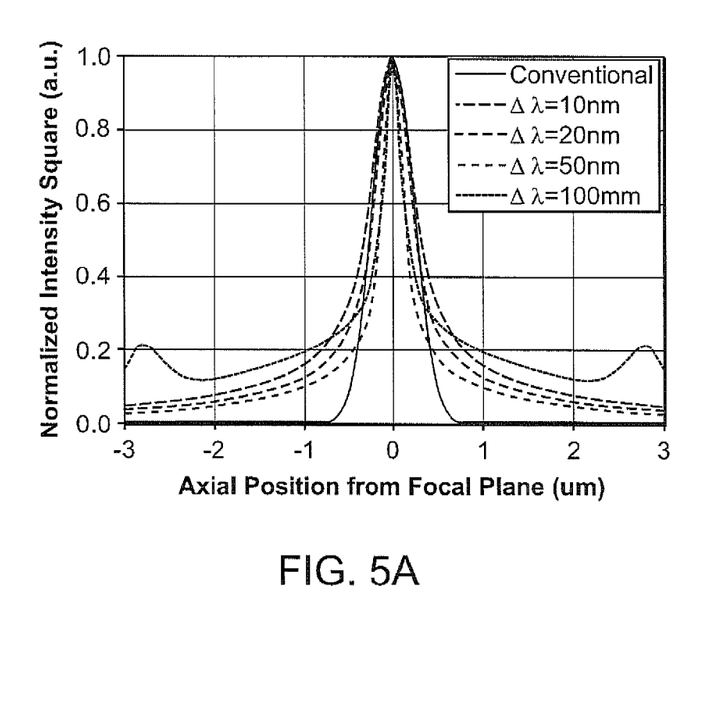
FIGS. 5A-5B are graphs illustrating results for intensity square along an optical axis with different spectral bandwidth of optical pulse.
Figure 5B:
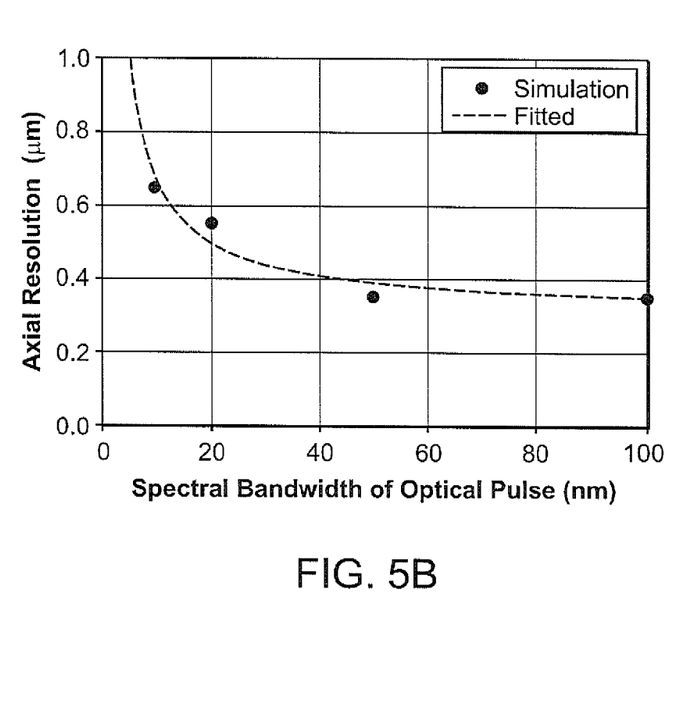

The axial resolution of the system can be estimated as a function of spectral bandwidth. In order to minimize the effect of NA, one can use different groove frequencies in the grating, depending on $\Delta\lambda=\lambda-\lambda_0$, as shown in FIG. 5A. As bandwidth increases, excitation pulse width shortens inversely resulting in better axial resolution, as shown in FIG. 5B. It is seen that the axial resolution decreases (improves) inversely with spectral bandwidth $\Delta\lambda$ or temporal pulse width $\tau_p$ for the transform-limited optical pulse.

Figure 6:
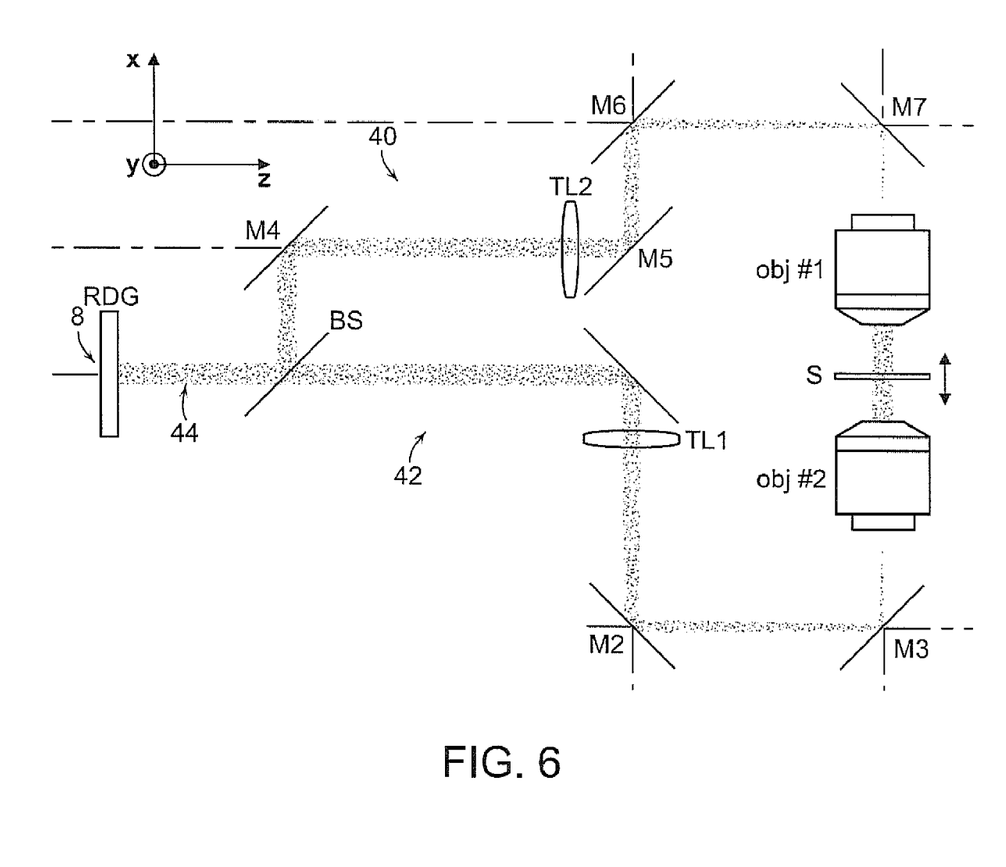
FIG. 6 is a schematic diagram illustrating a 3D lithographic microfabrication system based on standing wave two-photon excitation wide-field illumination.

FIG. 6 show a 3D lithographic microfabrication system based on standing wave two-photon excitation wide-field illumination (SW-TPE-WI). It is similar to the 3D lithographic microfabrication system of FIG. 1 except for using two opposite directional wide-field illumination instead of one directional illumination. For purposes of clarity FIG. 6 focuses at the point where dispersion occurs using the reflective diffraction grating structure 8. Note reflective diffraction grating structure 8 can also perform transmission dispersion. This technique results in lower background excitation beyond the focal plane as well as higher axial resolution than that system of FIG. 1. FIG. 6 shows a single beam 44 with optical pulses separates into two identical beams 40, 42 at the 50:50 beam splitter (BS), and they propagate through two different optical paths and recombine, using objectives #1 and #2, at the focal plane using mirrors M2-M7. Note that the two beams are symmetric around the focal plane, not an optical axis. Tubes TL1 and TL2 are used to focus both beams to the their objectives #1 and #2 for illumination. A specimen is between position at the focal plane of both objectives #1 and #2.

Figure 7A:
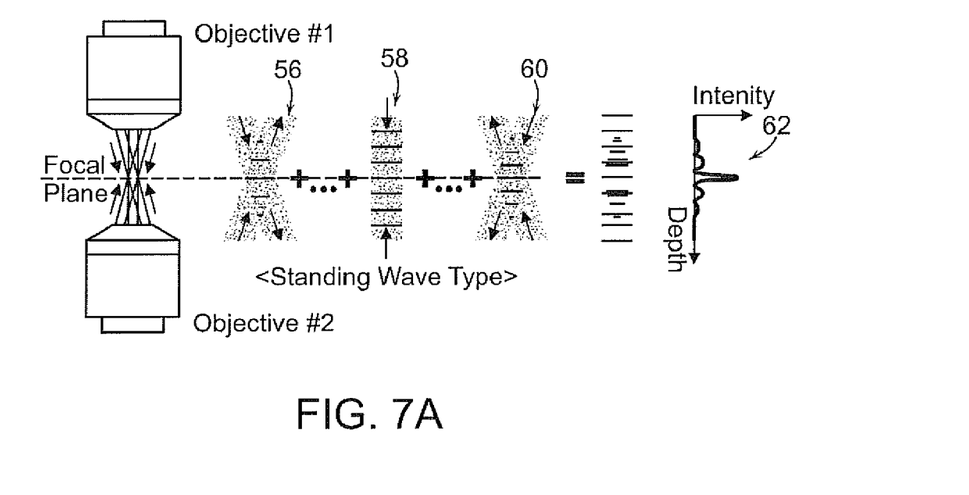
FIGS. 7A-7B are schematic diagrams illustrating wavefronts associated using standing wave two-photon excitation wide-field illumination and the system shown in FIG. 1.
Figure 7B:
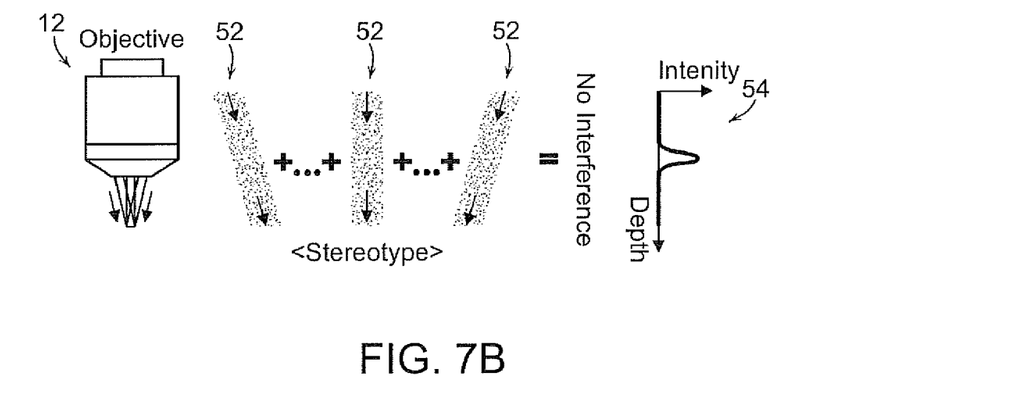

With standing wave technique, all the wave fronts in different wavelength beams in objectives #1 and #2 are overlapped (or in phase) at the focal plane, as shown in FIG. 7A. FIG. 7B shows wavefronts 52 of the objective 12 used in the system of FIG. 1 that does not generate interference pattern 54 in the axial direction, and an optical pulse being restored at the focal plane when waves pass through focal plane. However, FIG. 7A shows two beams 56, 60 with same wavelength travel from the different directions (downward and upward), and the interference patterns exist where they are overlapped. This pattern 62 is also perpendicular to an optical axis (parallel to focal plane). Interference pattern peaks for all the wavelengths included in the optical pulse are designed to be exactly overlapped at the focal plane, which means very high instantaneous intensity peak happens only at the focal plane when all the wavelength components are overlap together. Since the period between interference pattern peaks depends on the wavelength, interference pattern peaks cannot be overlapped any more in the space other than focal plane. Additionally, it also enhances axial optical resolution since standing wave 58 provides the interference period of equal or smaller than half of wavelength.

The invention proposes a 3D two-photon lithographic microfabrication, based on depth-resolved wide-field illumination which is also useful in the microscopy. A mathematical model was derived for calculating axial resolution in the case of depth-resolved wide-field illumination with temporal focusing. With numerical simulations, dominant design parameters to affect axial resolution can be obtained as follows:

$$FWHM_z \propto \frac{FOV \cdot \tau_p}{NA} \quad (9)$$

Importantly, the simulation will allow one to better design the physical instrument by evaluating how various parameters, such as grating frequency, beam waist, and laser bandwidth, will affect patterning resolution at the focal plane.

Optical simulation alone is not sufficient to predict the resolution of the structures to be patterned in the microfabrication system. Since photopolymerization is a highly nonlinear kinetic process, it is impossible to predict the characteristics of the structures to be produced without coupling the optical model with a model of photopolymerization. Comprehensive photo-chemical models will be created of two-photon photopolymerization processes induced by either spatial or temporal focusing. The availability of this model will allow one to find optimal experimental parameters to improve fabrication throughput and resolution. Finally, one can compare the axial point spread function (PSF) measurements with the simulation results, and fabricate microstructures for biological applications with the inventive microfabrication system.

Although the present invention has been shown and described with respect to several preferred embodiments thereof various changes, omissions and additions to the form and detail thereof may be made therein, without departing from the spirit and scope of the invention.

What is claimed is:

1. A fabrication system comprising:
    a optical pulse generator for providing an optical pulse having a spectral bandwidth and including monochromatic waves having different wavelengths;
    a dispersive element receives a second optical pulse associated with said optical pulse, and disperses said second optical pulse at different angles on the surface of the dispersive element depending on wavelength; and
    one or more focal elements receiving the dispersed second optical pulse produced on said dispersive element, said one or more focal elements recombine the dispersed second optical pulse at a focal plane on a specimen where the width of the optical pulse is restored at the focal plane.

2. The fabrication system of claim 1 further comprising a pattern forming element that receives said optical pulse and produces a patterned formed beam to generate 2-D pattern at the focal plane.

3. The fabrication system of claim 1, wherein said secondary optical pulse comprises said patterned form beam.

4. The fabrication system of claim 1, wherein said secondary optical pulse comprises said optical pulse.

5. The fabrication system of claim 1, wherein said focal element comprises a tube lens, beam splitter, or an objective to recombine the dispersed second optical pulse at said focal plane.

6. The fabrication system of claim 1, wherein said optical pulse generator comprises a pulse laser.

7. The fabrication system of claim 2, wherein said patterned forming element comprises a digital micromirror device (DMD) with digital light processing (DLP), a spatial modulator (SLM), or a microelectromechanical system (MEMS) mirror array.

8. The fabrication system of claim 1, wherein said dispersed second optical pulse is splitted into a plurality of dispersed optical wavefronts wherein said one or more focal elements are positioned to recombine said dispersed optical wavefronts so as to lower background excitation beyond said focal plane as well as improve axial resolution.

9. The method of claim 1, wherein said secondary optical pulse comprises said patterned form beam.

10. A method of performing operations of an imaging system comprising:
    providing an optical pulse having a spectral bandwidth and includes monochromatic waves having different wavelengths;
    receiving a second optical pulse associated with said optical pulse;
    dispersing said second optical pulse at different depending on wavelength;
    receiving the dispersed second optical pulse produced; and
    recombining the dispersed second optical pulse at a focal plane on a specimen where the width of the optical pulse is restored at the focal plane.

11. The method of claim 10 further comprising receiving said optical pulse and producing a patterned formed beam to generate 2-D pattern at the focal plane.

12. The method of claim 11, wherein said patterned forming element comprises a digital micromirror device (DMD) with digital light processing (DLP) or a microelectromechanical system (MEMS) mirror array.

13. The method of claim 10, wherein said secondary optical pulse comprises said patterned form beam.

14. The method of claim 10, wherein said secondary optical pulse comprises said optical pulse.

15. The method of claim 10, wherein said recombining the dispersed second optical pulse uses a tube lens, beam splitter, or an objective to recombine the dispersed second optical pulse at said focal plane.

16. The method of claim 10, wherein said optical pulse generator comprises a pulsed laser.

17. The method of claim 10 further comprising acquiring fluorescence 2-D images at a conjugate plane of an object plane.

18. A method of forming an imaging system comprising:
    providing a optical pulse generator for providing an optical pulse having a spectral bandwidth and includes monochromatic waves having different wavelengths;
    positioning a dispersive element to receive a second optical pulse associated with said optical pulse and disperses said second optical pulse at different angles on the surface of the dispersive element depending on wavelength; and
    arranging one or more focal elements to receive the dispersed second optical pulse produced on said dispersive element, said one or more focal elements recombine the dispersed second optical pulse at a focal plane on a specimen where the width of the optical pulse is restored at the focal plane.

19. The method of claim 18 further comprising positioning a pattern forming element that receives said optical pulse and produces a patterned formed beam to generate 2D pattern at the focal plane.

20. The method of claim 19, wherein said patterned forming element comprises a digital micromirror device (DMD) with digital light processing (DLP) or a microelectromechanical system (MEMS) mirror array.

21. The method of claim 18, wherein said secondary optical pulse comprises said optical pulse.

22. The method of claim 18, wherein said focal element comprises a tube lens, beam splitter, or an objective to recombine the dispersed second optical pulse at said focal plane.

23. The method of claim 18, wherein said optical pulse generator comprises a pulsed laser.

24. The method of claim 18, wherein said dispersed second optical pulse is splitted into a plurality of dispersed optical wavefronts wherein said one or more focal elements are positioned to recombine said dispersed optical wavefronts so as to lower background excitation beyond said focal plane as well as improve axial resolution.

* * * * *